(12) United States Patent
Redecker

(10) Patent No.: US 6,667,729 B2
(45) Date of Patent: Dec. 23, 2003

(54) METHOD OF ELECTRICALLY ADDRESSING POLYMER FLUORESCENT DISPLAY ELEMENT AND POLYMER FLUORESCENT DISPLAY ELEMENT

(75) Inventor: Michael Redecker, Berlin (DE)

(73) Assignee: Samsung SDI Co., Ltd., Kyungki-do (KR)

( * ) Notice: Subject to any disclaimer, the term of this patent is extended or adjusted under 35 U.S.C. 154(b) by 355 days.

(21) Appl. No.: 09/852,627

(22) Filed: May 11, 2001

(65) Prior Publication Data

US 2002/0027537 A1 Mar. 7, 2002

(30) Foreign Application Priority Data

Sep. 1, 2000 (DE) .......................... 100 42 974

(51) Int. Cl.[7] ................................. G09G 3/32
(52) U.S. Cl. ........................ 345/82; 345/75.1
(58) Field of Search ................ 345/44, 46, 47, 345/39, 54, 45, 76, 77, 73, 63, 82, 105, 106, 204, 75.1, 75.2; 315/169.1, 169.4, 291; 349/202; 359/296

(56) References Cited

U.S. PATENT DOCUMENTS 5,838,416 A * 11/1998 Chen et al. ............... 349/202
5,869,350 A    2/1999 Heeger et al.
6,445,489 B1 * 9/2002 Jacobson et al. ........... 359/296
6,456,016 B1 * 9/2002 Sundahl et al. ............ 315/291
6,483,245 B1 * 11/2002 Weindorf et al. ............ 315/82

FOREIGN PATENT DOCUMENTS

EP    294 061    8/1993
EP    423 283    1/1995

OTHER PUBLICATIONS

Organische Leuchtdioden: Spektroskopie im elektrischen feld und elektrische Untersuchungen, 1995.

* cited by examiner

Primary Examiner—Chanh Nguyen
(74) Attorney, Agent, or Firm—Leydig, Voit & Mayer, Ltd.

(57) ABSTRACT

A method for electrically addressing fluorescent display element based on polymers and/or low molecular-weight organic materials using a fluorescent quenching effect due to an electric field. The method includes changing positive voltages applied to bright pixels in inverse relation to ambient light intensity, and changing negative voltages applied to dark pixels in direct relation to the ambient light intensity. An organic light-emitting diode display (OLED) mode and a field quenching photoluminescence emission device (FQPED) mode are employed according to the ambient light intensity of the display element.

6 Claims, 1 Drawing Sheet

METHOD OF ELECTRICALLY ADDRESSING POLYMER FLUORESCENT DISPLAY ELEMENT AND POLYMER FLUORESCENT DISPLAY ELEMENT

BACKGROUND OF THE INVENTION

1. Field of the Invention

The present invention relates to a method for electrically addressing fluorescent display elements and a display element, and more particularly, to a method for electrically addressing fluorescent display elements to which display technologies such as organic light-emitting diode display (OLED) and the like are applied, and a display element.

2. Description of the Related Art

Display technologies such as a liquid crystal display (LCD), a field emission display (FED) and vacuum fluorescence display (VFD) as well as organic light-emitting diode display (OLED) constitute the general state of the art and have already been applied.

An LCD has a drawback in that there is an aligned monodomain of a liquid crystal between polarizers in an idle state. The alignment of this domain can be changed by means an applied electric field. In this case, the light absorption based on the combination of liquid crystal and polarizers is changed.

LCD displays dominate the market for flat-type displays and monitors. The LCD displays require low energy consumption when ambient light is present. However, if this is not the case, power consumption for additional lighting is required. Also, fast-moving images may be distorted due to a narrow angle of viewing and a low-switching speed of liquid crystals.

In the case of a VFD, electrons are emitted from a heated grid cathode under vacuum. The emitted electrons are accelerated by an electric field and collide with a light-emitting phosphor layer. This operating mode is similar to that of a picture tube.

In the case of an FED, electrons are emitted from a cold cathode array under vacuum in a strong electric field and collide with a phosphor layer, leading to light emission.

The VFD and FED are unfavorably thick for use as display elements, have relatively high operating voltages and a high input power for heating the cathode, particularly in a VFD, and are unsuitable as flexible displays.

OLEDs require injection of charge carriers for forming an excited state by recombination of charge carriers. The excited state decays under light emission (see EP 0423 283, U.S. Pat. No. 5,869,350 and EP 029 40 61). The OLEDs have a very short switching time and a wide angle of viewing. Compared with LCD displays requiring additional lighting, the OLEDs, which do not require adequate ambient light, consume less power. These advantages, however, are canceled when intense ambient light prevails. This is because visually sensed contrast is lowered due to the effect of ambient light.

In addition to the above-described generally known emissive operating modes, the effect of fluorescence quenching due to an electric field has been described in a doctoral thesis by Martin Deussen, Marburg University, 1995. This effect is applied to display elements similar to or identical with OLED display elements.

SUMMARY OF THE INVENTION

To solve the above problem, it is an object of the present invention to provide a fluorescent display element and a method for addressing fluorescent display elements which can maintain visually sensed contrast at a constant level regardless of a change in the intensity of ambient light and can reduce power consumption.

To achieve the above object, there is provided a method for electrically addressing a display element based on polymers and/or low molecular-weight organic materials by a fluorescence quenching effect due to an electric field. The method includes the steps of changing positive voltages applied to bright pixels to be inversely related to the intensity of ambient light, and changing negative voltages applied to dark pixels to be related to the intensity of ambient light, whereby an organic light-emitting diode display (OLED) mode and a field quenching photoluminescence emission device (FQPED) mode are performed according to the intensity of ambient light of the display element.

According to another aspect of the present invention, there is provided a display element based on polymers and/or low molecular-weight organic materials by a fluorescent quenching effect due to an electric field. The display element is adapted to operate in an organic light-emitting diode display (OLED) mode under dark ambient light and in a field quenching photoluminescence emission device (FQPED) mode under bright ambient light, the latter working based on the fluorescent quenching effect due to an electric field.

According to the display element addressing method and the display element of the present invention, the OLED mode is selected under dark ambient light and the FQPED mode is selected under bright ambient light. Accordingly, the light emitted from the OLED display can be prevented from being weakened due to the light from an external light source. For example, even under intense sunlight, the contrast of the OLED display increases. Therefore, in disregard of a change in the intensity of ambient light, the contrast can be maintained at a constant level. Also, power consumption can be reduced by using the FQPED mode.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENT

Figure 1:
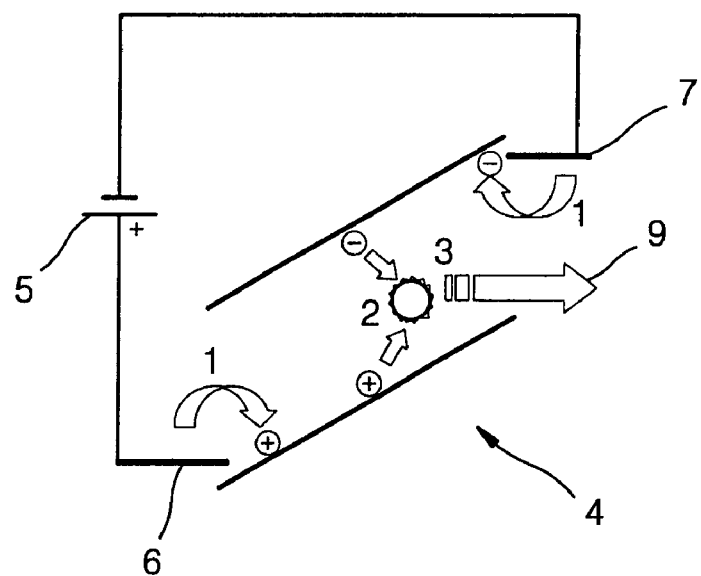
FIG. 1 shows the functioning principle of the OLED mode according to the present invention.
Figure 2:
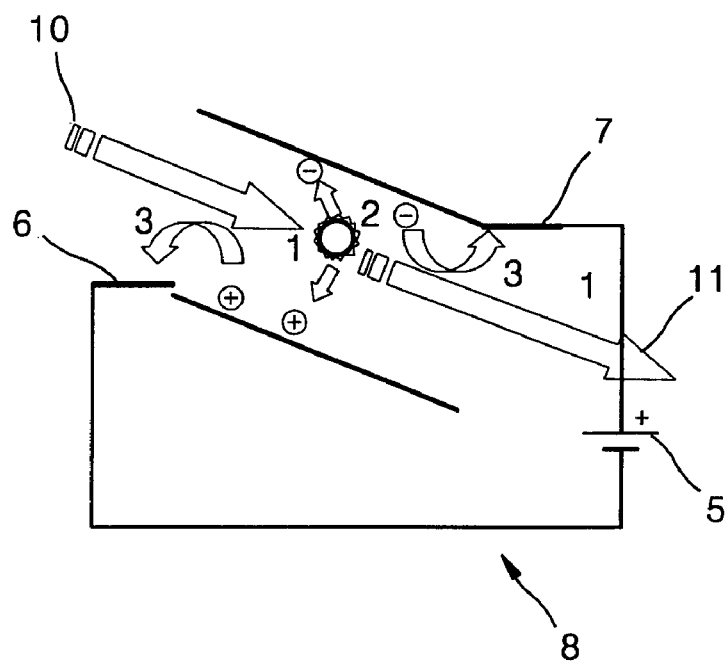
FIG. 2 shows the functioning principle of the FQPED mode according to the present invention.

FIG. 1 shows the functioning principle of the OLED mode according to the present invention, and FIG. 2 shows the functioning principle of the FQPED mode according to the present invention.

Referring to FIG. 1, a display element 4 based on the functioning principle of an OLED includes a voltage source 5, a transparent contact 6, e.g., of ITO (Indium Tin Oxide) and a metal contact 7, e.g., of aluminum. In the case where the OLED functioning principle is concerned, charge carriers are injected in a first step as denoted by reference numeral 1, for charge carrier recombination and excited state formation in a second step as denoted by reference numeral 2. In a third step as denoted by reference numeral 3, the excited state decays under light emission.

The OLED mode based on the above-described functioning principle is applied in darkness and/or with weak ambient light. In other words, according to the OLED mode applied in darkness, positive voltages are applied, which cause the brightness of the pixels to increase. Accordingly, fluorescent light due to charge carrier recombination is irradiated.

Referring to FIG. 2, a display element 8 based on the FQPED functioning principle includes a voltage source 5, a transparent contact 6, e.g., of ITO (Indium Tin Oxide) and a metal contact 7, e.g., of aluminum, which are the same as those in FIG. 1. Here, in order to attain emission, the light energy supplied from an external light source 10 such as sunlight or inorganic light-emitting diode must be incident. In a first step 1, an excited state is established by ambient light 10. In a second step 2, the excited state decays under emission of light 11 without an electric field. If an electric field is applied in reverse bias direction, dissociation of excited state into charge carriers is facilitated and the intensity of emitted light 11 will decrease. In a third step 3, the charge carriers are removed by the contacts 6 and 7.

In practice, this is realized in such a way that the forward voltage for bright pixels is reduced in dependence of the intensity of the ambient light. Subsequently, there is a decline in the portion of irradiated light which is caused by injected charge carriers, while fluorescent light originating from the conversion of ambient light is still present. At the same time, the reverse bias voltage of the surrounding pixels is increased in order to reduce the emission of fluorescent light.

With very intense irradiation, the forward operation of bright pixels may be fully dispensed with. Under this condition, only the FQPED mode is operated. Switching between modes can be automatically executed by driving circuits employing elements for converting light energy into electric energy. In other words, positive voltages applied to bright pixels are inversely related to the intensity of ambient light and changing negative voltages applied to dark pixels are directly related to the intensity of ambient light.

Operation exclusively in the FQPED mode, that is, independent of the level of ambient light, is also possible. In such a case, a lower power input is also achieved compared with OLED operation under intense ambient light. If required, light sources, such as highly efficient inorganic light-emitting diodes, may be additionally applied.

In adopting the FQPED mode of FIG. 2, in order to reduce energy consumption for dark pixels, it is necessary to minimize injection of charge carriers in the reverse direction, which is achieved by appropriately selecting materials of the contacts 6 and 7, particularly the cathode material. These materials, such as barium, advantageously have a low electron work function.

In an embodiment of a display element according to the present invention, there is provided a matrix display of a first layer of a highly conductive polymer with a thickness of 30 nm, on a pre-structured glass substrate coated with indium tin oxide (ITO). The first layer is at least one of polyethylenedioxothiophene (PEDOT), polyaniline, polypyrrole, and related materials. The first layer is dried and a second layer made of a yellow emitting polymer based on a poly derivative, e.g., polyphenylenevinylene, is formed thereon to a thickness of, for example, 50 nm. Then, a cathode layer is vapor-deposited. The cathode layer typically includes metals with low work functions. As a typical embodiment, a thin layer of lithium fluoride combined with an aluminum layer or a barium layer combined with a layer of aluminum or silver is used. The thus-formed display panel is then encapsulated.

The display can be illuminated with, for example, a blue light-emitting diode based on inorganic semiconductors. Under such conditions, polymers of bright pixels radiate yellow light. Also, as a reverse voltage of 16 V is applied to dark pixels, the corresponding pixels become significantly darker due to the above-described FQPED effect. Accordingly, the visually sensed contrast is not reduced even under bright ambient light such as sunlight. Thus, since photoluminescent light having an intensity directly related to the ambient light energy is irradiated, unnecessary power consumption under bright ambient light can be reduced.

As described above, in the method for addressing fluorescent display elements and the display element according to the present invention, an OLED mode is selected under dark ambient light and an FQPED mode is selected under bright ambient light. Accordingly, the contrast created by the light emitted from the OLED display can be prevented from being weakened due to the light from an external light source. For example, even under intense sunlight, the contrast of the OLED display increases. Therefore, regardless of a change in the intensity of ambient light, the contrast can be maintained at a constant level. Also, power consumption can be reduced by using the FQPED mode.

Although the invention has been described with respect to a preferred embodiment, it is not to be so limited as changes and modifications can be made which are within the full intended scope of the invention as defined by the appended claims.

What is claimed is:

1. A method of electrically addressing a display element based on polymers and/or low molecular-weight organic materials using a fluorescent quenching effect due to an electric field, the method comprising:

changing positive voltages applied to bright pixels in inverse relation to ambient light intensity; and changing negative voltages applied to dark pixels in direct relation to the ambient light intensity, whereby an organic light-emitting diode display (OLED) mode and a field quenching photoluminescence emission device (FQPED) mode are employed according to the ambient light intensity at the display element.

2. A display element including at least one of polymers and low molecular-weight organic materials using a fluorescent quenching effect due to an electric field, the display element operating in an organic light-emitting diode display (OLED) mode in low ambient light and in a field quenching photoluminescence emission device (FQPED) mode in bright ambient light, according to a fluorescence quenching effect due to an electric field.

3. The display element according to claim 2, further comprising an illuminating device, whereby the display element operates exclusively in the FQPED mode.

4. The display element according to claim 2, including a first layer of highly conductive polymer on a pre-structured glass substrate and a second layer of an emissive polymer on the first layer.

5. The display element according to claim 4, wherein the first layer is at least one of polyethylenedioxidhtiophene (PEDOT), polyaniline and polypyrrole.

6. The display element according to claim 4, including a cathode material corresponding to the transparent electrode for minimizing charge injection in a reverse direction.

* * * * *